(12) United States Patent
Breicher

(10) Patent No.: US 9,066,440 B2
(45) Date of Patent: Jun. 23, 2015

(54) SIDE BRACKET

(75) Inventor: Robert Breicher, Paderborn (DE)

(73) Assignee: dSPACE digital signal processing and control engineering GmbH, Paderborn (DE)

( * ) Notice: Subject to any disclaimer, the term of this patent is extended or adjusted under 35 U.S.C. 154(b) by 0 days.

(21) Appl. No.: 13/399,493

(22) Filed: Feb. 17, 2012

(65) Prior Publication Data

US 2012/0223197 A1    Sep. 6, 2012

(30) Foreign Application Priority Data

Mar. 1, 2011  (DE) .......................... 10 2011 012 757

(51) Int. Cl.
*H02B 1/01*  (2006.01)
*H05K 7/14*  (2006.01)

(52) U.S. Cl.
CPC ............ *H05K 7/1418* (2013.01); *H05K 7/1411* (2013.01)

(58) Field of Classification Search
CPC .......................... H05K 7/1418; H05K 7/1411
USPC ........ 248/221.11, 222.14, 205.1; 361/679.31, 361/679.39, 799, 796, 797, 679.33, 679.35, 361/679.36; 312/223.2
See application file for complete search history.

(56) References Cited

U.S. PATENT DOCUMENTS

| 6,304,457 | B1 * | 10/2001 | Liu et al. ......................... 361/799 |
| 6,882,526 | B2 * | 4/2005 | Neukam et al. ........... 361/679.39 |
| 2011/0051350 | A1 * | 3/2011 | Zhang et al. .............. 361/679.31 |

FOREIGN PATENT DOCUMENTS

DE        102 13 526  A1    10/2003

* cited by examiner

*Primary Examiner* — Todd M Epps
(74) *Attorney, Agent, or Firm* — Muncy, Geissler, Olds & Lowe, P.C.

(57) ABSTRACT

A side bracket for holding a housing in a rack is provided that includes a profile section with a vertical mounting plate that can be used to attach the profile section in a rack. The profile section includes a horizontal slide plate attached to the mounting plate, upon which slide plate a housing may be placed and moved in a sliding manner, and includes at least one retaining element with which a force acting in the horizontal direction from the profile section can be exerted on a side wall of the housing.

14 Claims, 3 Drawing Sheets

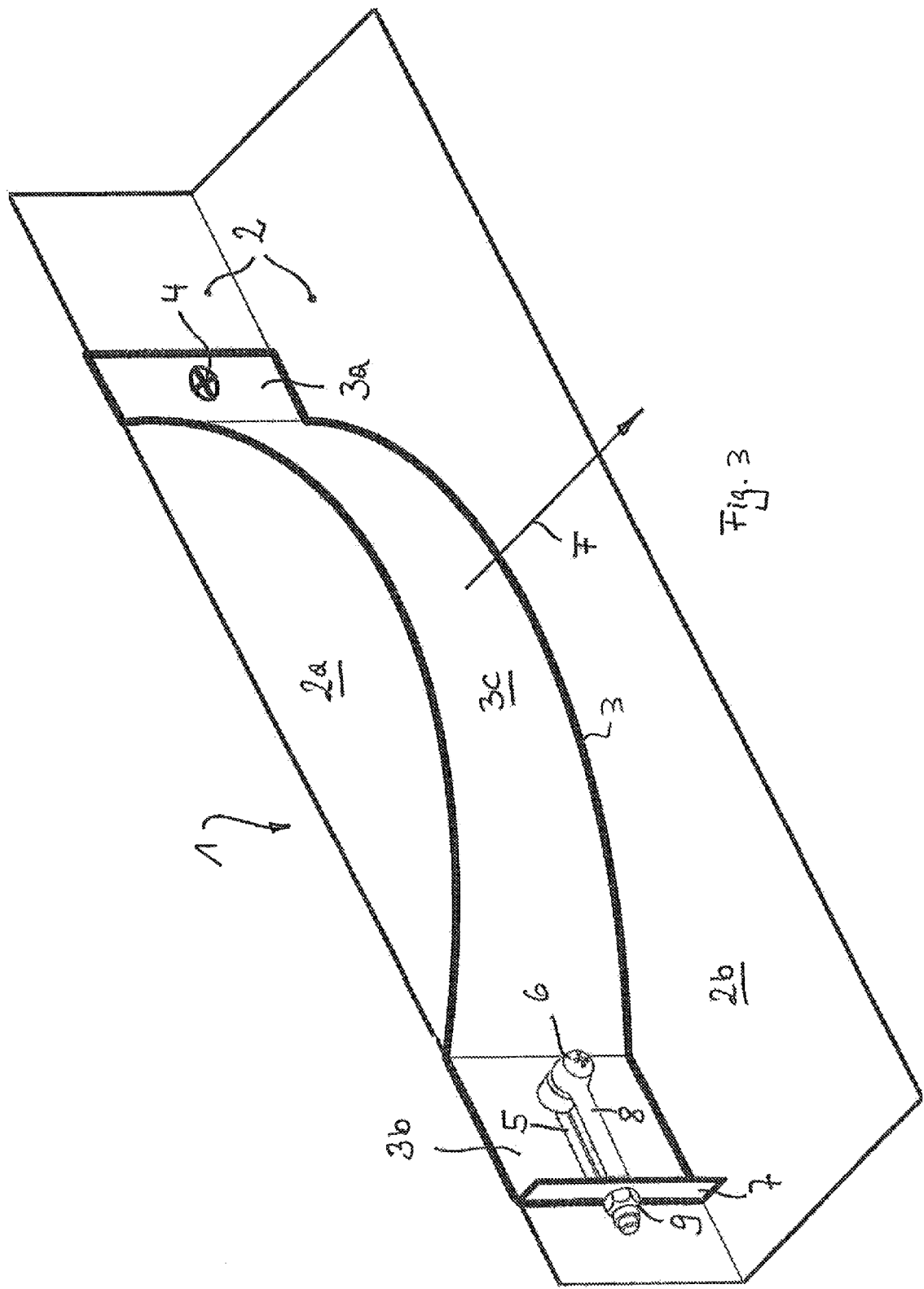

SIDE BRACKET

This nonprovisional application claims priority under 35 U.S.C. §119(a) to German Patent Application No. DE 102011012757.7, which was filed in Germany on Mar. 1, 2011, and which is herein incorporated by reference.

BACKGROUND OF THE INVENTION

1. Field of the Invention

The invention relates to a side bracket for holding a housing in a rack, having a profile section with a vertical mounting plate that can be used to attach the profile section in a rack, for example to a side wall of a rack.

2. Description of the Background Art

Side brackets of this nature are used to give housings that are to be mounted in a rack better support as compared to the mere attachment of the housing's front panel to the front of the rack that is otherwise done. This makes good sense, especially when very heavy housings are concerned, which cannot simply be attached to a rack at the front panel, as is the case for computers, for instance. Normally, such housings and racks are those conforming to the 19-inch industry standard, but the invention is not restricted to these types of housings and racks.

To improve the attachment, one such side bracket is attached to each vertical side wall of the housing, for example with screws, wherein the side bracket is then mounted together with the housing in the rack, once again with screws, either at the side wall or also in a rear area. Accordingly, such a side bracket has a longitudinal extent in the direction of the side wall of the housing and/or rack.

It is considered a disadvantage here that, for attachment with screws, the housing has to be positioned very precisely in order to permit screwing to the rack in the holes or recesses provided for this purpose. Several people are needed for this task, especially when very heavy housings are involved.

SUMMARY OF THE INVENTION

It is therefore an object of the present invention to provide an improved side bracket that permits mounting of a housing in a rack in a simple way, and in addition that ensures that the housing is securely fixed in position, including in the side and/or rear regions.

This object is attained according to an embodiment of the invention in that a profile section includes a horizontal slide plate attached to the vertical mounting plate, upon which slide plate a housing may be placed and moved in a sliding manner, and includes at least one retaining element with which a force acting in the horizontal direction from the profile section can be exerted on a side wall of the housing.

Thus, such a side bracket can first be fastened to the inside of a side wall of a rack, for example by screwing the mounting plate to this side wall. This results in an installed slide plate on the side wall. Installation is performed on both side walls of a rack with side brackets of appropriate mirror-image design.

A housing can then be placed on the slide plates that are then present and that extend from the respective mounting plates inward into the interior of the rack, and the housing can be pushed into the rack in a sliding manner until the front panel of the housing comes into contact with the rack front and can be screwed thereto. During this pushing-in process, the entire weight of the housing is borne by the slide plates, so that such installation can even be performed by a single person without difficulty.

In order to achieve positional stability of the housing in the rack that is not solely by means of the front panel screw attachment, provision can be made according to an embodiment of the invention for at least one retaining element to be arranged on the profile section of the side bracket, by means of which retaining element a force in the horizontal direction is exerted on the side wall of the housing facing the mounting plate, wherein the retaining element contacts the side wall. Because of the installation on both sides of the housing of two mirror-image side brackets according to the invention, opposing forces thus act on the housing from both sides with the result that the housing is fixed in position between the retaining elements of the opposite side brackets, in particular by being clamped between the retaining elements.

In an embodiment, provision can be made for at least one retaining element to be arranged on the mounting plate above the slide plate. Arrangement above the slide plate ensures that the retaining element always contacts an area of the side wall of a housing above its bottom surface, wherein the arrangement on the mounting plate makes it possible for the retaining element to be supported on the mounting plate so as to be able to produce the force in the direction toward the side wall of the housing.

In an embodiment, provision can be made for the force exerted by the retaining element on a side wall and/or the projection of the unloaded retaining element relative to the mounting plate to be adjustable.

The possibility is thus afforded of adapting the side bracket according to the invention to different housings, for example with regard to the width of the housing. For this purpose, the projection of the retaining element/the spacing of the retaining element from the mounting plate can be adjustable in a direction toward the side wall. For example, the retaining element in each of the two side brackets arranged in a rack can be adjusted such that the distance between the retaining elements of the two side brackets is smaller than the width of the housing in the unloaded excursion of the retaining elements. In particular, it is advantageous here if the retaining elements can deflect toward the mounting plate in opposition to a spring force when such a force is exerted on a retaining element by a side wall of a housing. Accordingly, if the housing is pushed between the side brackets, then the retaining elements deflect and exert a force on the applicable side wall of the housing. For this purpose, a retaining element may itself constitute a spring element, for example, or may be preloaded with a spring in the direction toward a side wall of a housing.

In order to make it easier to push in a housing between the retaining elements, provision can also be made for each retaining element to have a lead-in bevel which the housing contacts first when being pushed in, in order to then press the retaining element back by means of this lead-in bevel, for example in opposition to a spring force.

In an embodiment, the profile section can be designed as an L-profile with a longitudinal extent along a side wall of a rack mount housing and/or rack. This is especially advantageous, since it is thus possible to employ longitudinal profiles that are readily available commercially and inexpensive in order to produce a side bracket in accordance with the invention. With such an L-profile, one leg of the L can form the slide plate and the other can form the mounting plate. At the same time, the at least one retaining element can be arranged on this mounting plate.

In another embodiment, such a retaining element can be designed as a plate, for example a strip profile, at least part of which extends parallel to the mounting plate, wherein at least one compression spring is located between the strip profile, in particular the parallel region thereof, and the mounting plate, by means of which spring the strip profile can be pushed away from the mounting plate and toward a side wall of a housing. At its start (viewed in the insertion direction), a strip profile can have, e.g., an angled chamfer or a rounded bend that forms a lead-in bevel as explained above.

In a further embodiment, provision can also be made for the retaining element to be implemented as an arched strip profile, in particular a metal strip, that is concave toward the mounting plate and/or convex toward the side wall of a rack mount housing and at least one end of which is connected to the mounting plate.

Provision can thus be made here for the other end to contact the mounting plate at least loosely or else to be attached to the mounting plate.

As a result of the arched shape, a sort of leaf spring is produced, which contacts the side wall of a housing with the outwardly curved region, which is to say with the region that has the maximum distance from the mounting plate, and thus exerts a force on this wall. As a result of the arched shape, a lead-in bevel is automatically formed, as well.

Provision can be made for both ends of the strip profile to be attached to the mounting plate such that they are stationary. In such a case, the position of the strip profile is predetermined and cannot be changed. In like manner, the spring force that is provided for certain housing widths is predetermined.

Provision can also be made for the strip profile to be attached to the mounting plate with one end stationary and one end movable. This has the advantage that the distance between the ends of the arched strip profile attached to the mounting plate can be adjusted, which has an effect on the degree of curvature of the strip profile, since its length remains the same. In this way, the distance between two opposite spring elements of two opposite side brackets can be adjusted, as can the spring force that acts on the side walls of the housing once it has been pushed into place.

In yet another embodiment, both ends can be attached to the mounting plate such that they are movable if necessary.

In order to facilitate such adjustments of the at least one movably attached end, provision can be made for such an end to have a strip region that is parallel to the mounting plate and in which a slotted hole is arranged, through which hole a mounting screw projects that can be used to attach the parallel strip region to the mounting plate. In this way, the distance between the ends of the strip profile can be adjusted within the length of the slotted hole. The adjustable end can then be fixed in place with the mounting screw. Provision can also be made here for the mounting plate to be attachable to a side wall of a rack at the same time by means of this same mounting screw.

The adjustability is additionally made even easier by the means that, in one possible refinement, one end of an adjusting screw is attached to the mounting screw; this adjusting screw extends parallel to the slotted hole and is parallel to the surface of the slide plate, and its other end projects through a tab on the end of the strip profile and bears at least one adjusting nut. Here, the mounting screw is stationary on the mounting plate, so that changing the position of the adjusting nut changes the location of the tab, and hence the end of the strip profile, and thus the projection of the arched strip profile can be changed. This design has the further advantage that the adjusting nut is still accessible even when a housing has been inserted in a rack, since this adjusting nut is located in a region between the side wall of the housing and the side wall of the rack.

Moreover, provision can be made in an embodiment for the strip profile to have a height that decreases in the direction of the maximum curvature starting from the ends of the strip profile. In this way, the stiffness of the strip profile is reduced so that the curvature can also be changed in a simple way by shifting at least one of the ends of the strip profile. In addition, the region with reduced height can be arranged more easily between narrowly spaced protrusions that may be present on the side wall of a housing. Such protrusions may come about as a result of screw heads, for example.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 3 is another embodiment illustrating the retaining element of FIG. 2 as a component part in the design of FIG. 1.

DETAILED DESCRIPTION

Figure 1:
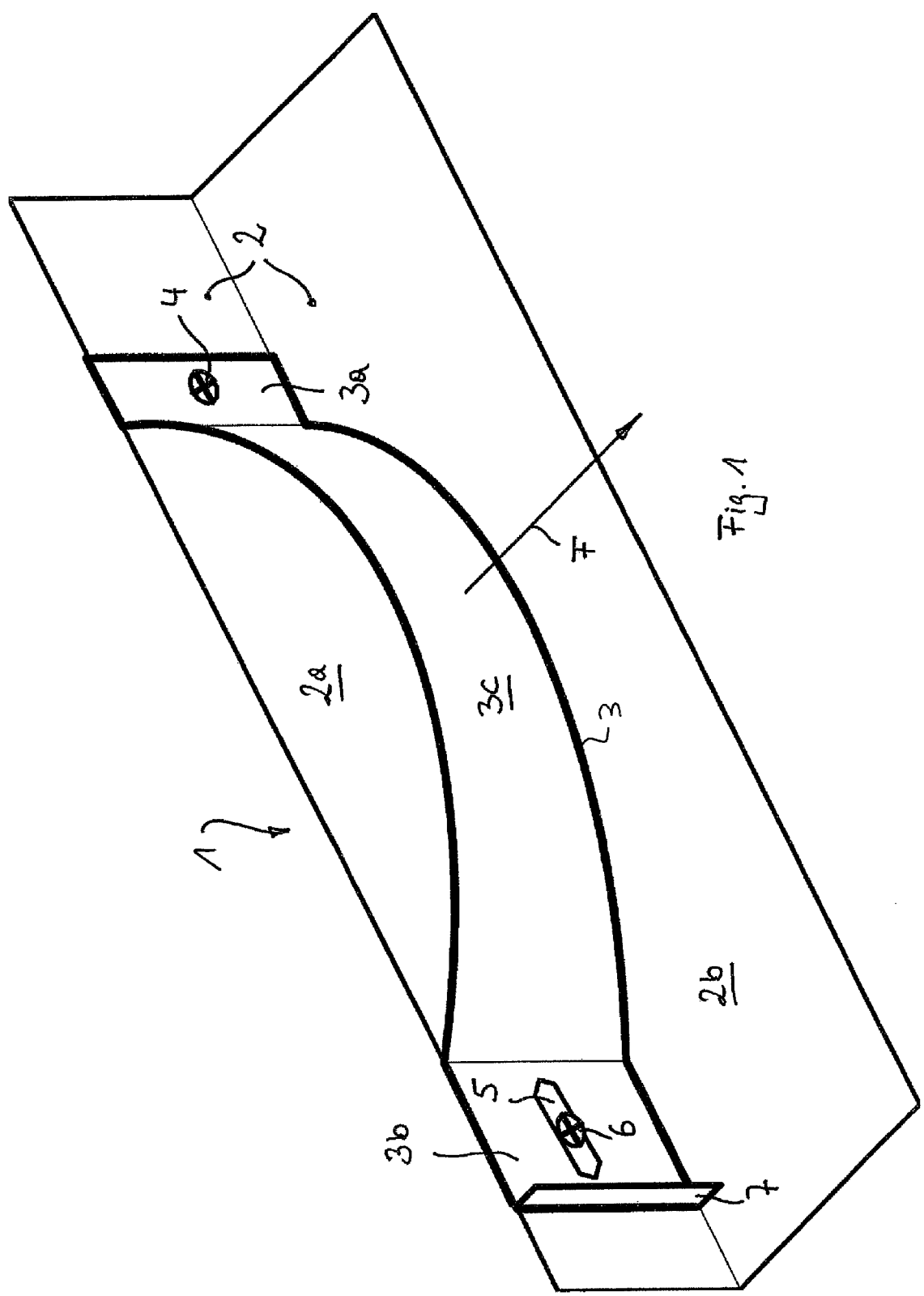
FIG. 1 shows a side bracket according to a first alternative.

FIG. 1 shows a side bracket 1 according to an embodiment of the invention. This side bracket includes an L-shaped profile section 2, wherein one leg 2a forms a mounting plate 2a, by which means the side bracket 1 can be attached to a side wall inside a rack. The embodiment shown here is intended for mounting on a left side wall of the rack.

The leg 2b forms a slide plate 2b, upon which a housing may be placed and pushed into the interior of the rack in a sliding manner. Located above the slide plate 2b is a retaining element 3, which is implemented as a strip profile and has, between its two ends 3a and 3b, a region 3c curved out in an arch that is concave toward the mounting plate 2a and convex toward a side wall of a housing.

This retaining element is attached to the mounting plate 2a and exerts a spring force parallel to the surface of the slide plate 2b in the direction of a side wall of the housing, as is shown by the arrow F. The two ends 3a and 3b each comprise a flat section that is parallel to the mounting plate 2a in orientation.

The end 3a, to the rear in FIG. 1, is affixed to the mounting plate 2a in a stationary manner via a fastening component, for example, a screw 4. This screw 4 can also serve to attach the entire side bracket 1 to a side wall in the interior of the rack, which is not shown.

In the part that is parallel to the mounting plate 2a, the front end 3b has a slotted-hole/recess 5, through which a fastening component, for example, a screw 6 projects into the mounting plate 2a and is stationary with respect thereto. In this way, the distance between the ends 3a and 3b can be adjusted within the displacement path provided by the slotted hole 5, causing a change in the curvature of the strip profile, and hence in the force F acting on a side wall of a housing. In addition, the side bracket as a whole can be attached in the rack with the screw 6.

For the purpose of simplified handling when shifting the ends 3a and 3b relative to one another, the movable end can have a tab 7, which is bent out of the plane of the parallel part of the end 3b and, for example, is essentially perpendicular to the mounting plate 2a.

Instead of a screw-mounting of the fixed end 3a using the screw 4, this end may also be integrally joined to the mounting plate 2a, for example by adhesive bonding or welding. Preferably, the entire arrangement including the profile section 2 and retaining element 3 is made of metal, wherein the retaining element 3 can be made of, e.g., a spring steel.

Figure 2:
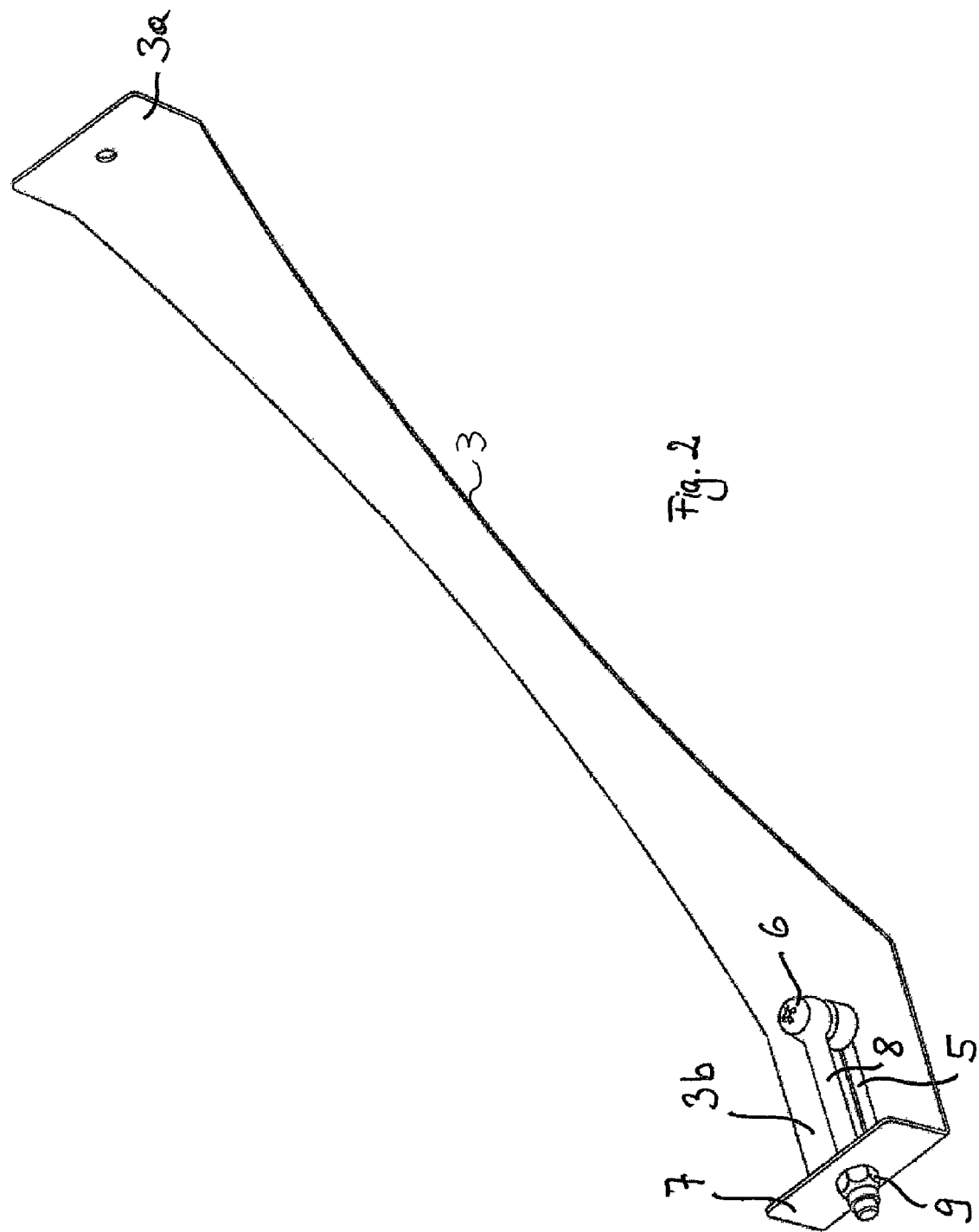
FIG. 2 shows a strip profile for a side bracket according to a second alternative.

FIG. 2 shows only a retaining element 3, as a component part, that serves as an alternative to the one in FIG. 1. Here, a front end 3b is designed substantially the same as in FIG. 1, in principle, except that an additional adjusting component, for example, screw 8 is attached to the screw 6; this adjusting screw extends in the direction of the slotted hole 5 and its end projects through the tab 7, for which purpose a hole is present in the tab. The end of the adjusting screw has an adjusting nut 9. By means of this nut 9, which is even accessible with a housing installed, the tab 7 and hence the entire end 3b is moveable relative to the screw 6, and in this way the curvature of the strip profile 3 can be changed, and augmented starting from the position shown.

Both figures also show that the arched part 3c of the strip profile decreases in height in the direction of maximum distance from the mounting plate 2a, by which means the stiffness of the retaining element 3 can be reduced.

FIG. 3 is another embodiment illustrating the retaining element 3 of FIG. 2 as a component part in the design of FIG. 1.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A side bracket configured to hold a housing in a rack, the side bracket comprising:
   a profile section with a vertical mounting plate that is adapted to attach the profile section in the rack, the profile section having a horizontal slide plate attachable to the mounting plate, wherein the housing is configured to be arranged and moved in a sliding manner upon the slide plate; and
   at least one retaining element with which a force acting in a horizontal direction from the profile section is configured to be exerted on a side wall of the housing, wherein the force exerted by the retaining element is adjustable.

2. The side bracket according to claim 1, wherein the at least one retaining element is arranged on the mounting plate above the slide plate.

3. The side bracket according to claim 1, wherein a projection or a distance of the unloaded retaining element relative to the mounting plate is adjustable.

4. The side bracket according to claim 1, wherein the profile section is configured as an L-profile with a longitudinal extent along a side wall of the housing.

5. The side bracket according to claim 1, wherein the retaining element is implemented as an arched strip profile or a metal strip that is concave toward the mounting plate and convex toward the side wall of the housing and at least one end of the retaining element is connected to the mounting plate.

6. The side bracket according to claim 5, wherein the strip profile:
   is attached to the mounting plate such that both ends are stationary, or
   is attached to the mounting plate such that one end is movable and the other end is stationary, or
   is attached to the mounting plate such that both ends are movable.

7. The side bracket according to claim 6, wherein an end that is movably attached has a strip region that is parallel to the mounting plate and in which a slotted hole is arranged, wherein a mounting screw projects through the hole, and wherein the mounting screw is configured to attach the parallel strip region to the mounting plate such that the mounting plate is attachable to a side wall of the rack.

8. The side bracket according to claim 7, wherein, attached to the mounting screw is one end of an adjusting screw whose extent is parallel to the slotted hole and whose other end projects through a tab on the end of the strip profile and bears an adjusting nut.

9. The side bracket according to claim 5, wherein the strip profile has a height that reduces in a direction of maximum curvature starting from ends of the strip profile.

10. The side bracket according to claim 1, wherein the profile section is configured as an L-profile with a longitudinal extent along a side wall of the rack.

11. The side bracket according to claim 1, wherein the retaining element is implemented as an arched strip profile or a metal strip that is concave toward the mounting plate or convex toward the side wall of the housing and at least one end of the retaining element is connected to the mounting plate.

12. The side bracket according to claim 1, wherein at least one end of the retaining element is movably attached to the mounting plate to provide the adjustable force.

13. The side bracket according to claim 12, wherein at least one end that is movably attached has a strip region that is parallel to the mounting plate and in which a slotted hole is arranged, wherein a mounting screw projects through the hole, and wherein the mounting screw configured to attach the parallel strip region to the mounting plate such that the force exerted by the retaining element is adjustable via a position of the mounting screw in the slotted hole.

14. The side bracket according to claim 13, wherein, attached to the mounting screw is one end of an adjusting screw whose extent is parallel to the slotted hole and whose other end projects through a tab on the end of the strip profile and bears an adjusting nut.

\* \* \* \* \*